(12) United States Patent
Arslan et al.

(10) Patent No.: US 8,159,832 B2
(45) Date of Patent: Apr. 17, 2012

(54) ELECTROMAGNETIC BAND GAP STRUCTURES AND METHOD FOR MAKING SAME

(75) Inventors: Ali Nadir Arslan, Helsinki (FI); Mikko Ville Samuli Hurskainen, Vantaa (FI)

(73) Assignee: Nokia Corporation, Espoo (FI)

( * ) Notice: Subject to any disclaimer, the term of this patent is extended or adjusted under 35 U.S.C. 154(b) by 1224 days.

(21) Appl. No.: 11/903,510

(22) Filed: Sep. 21, 2007

(65) Prior Publication Data

US 2009/0080172 A1  Mar. 26, 2009

(51) Int. Cl.
*H05K 7/14* (2006.01)
*H05K 7/18* (2006.01)

(52) U.S. Cl. ............... 361/799; 361/782; 361/784
(58) Field of Classification Search .......... 361/782–784; 343/700 MS
See application file for complete search history.

(56) References Cited

U.S. PATENT DOCUMENTS

| | | | | |
|---|---|---|---|---|
| 4,875,087 | A | 10/1989 | Miyauchi et al. | 357/71 |
| 5,929,729 | A | 7/1999 | Swarup | 333/246 |
| 6,456,249 | B1 * | 9/2002 | Johnson et al. | 343/702 |
| 6,476,771 | B1 | 11/2002 | McKinzie, III | 343/756 |
| 6,483,481 | B1 * | 11/2002 | Sievenpiper et al. | 343/909 |
| 7,456,792 | B2 * | 11/2008 | Baliarda et al. | 343/702 |
| 2004/0161035 | A1 | 8/2004 | Wedi | |

FOREIGN PATENT DOCUMENTS

WO   WO02/089063   11/2002

OTHER PUBLICATIONS

Electromagnetic band gap material: Exotic stuff for not-so-exotic EMI/EMC applications Shielding, Interference Technology, Annual EMC Guide 2004, Omar M. Ramahi, Ph.D., Shahrooz Shahparnia and Baharak Mohajer-Irvani, University of Maryland, College Park, MD.
Adaptive Interpolation Filter for Motion Compensated Prediction, Thomas Wedi, Institute of Communication Theory and Signal Processing, University of Hanover, Applelstr. 9a. 30167 Hannover, Germany, 2002 IEEE.

* cited by examiner

*Primary Examiner* — Tuan T Dinh
(74) *Attorney, Agent, or Firm* — Ware, Fressola, Van Der Sluys & Adolphson, LLP (57) ABSTRACT

A folded EBG structure has a plurality of cells arranged in a two-dimensional array. Each of the cells has an electrically conductive patch and an electrically conductive via coupled between the patch and a ground plane. In one dimension of the folded EBG structure, at least one patch in that dimension is folded into three sections located in different planes. In general, both ends of the folded EBS structure have folded patches. Via walls having electrically conductive vias are provided on both ends of a folded EBG structure for connecting the cell vias to the ground plane. The distance between each via wall and the folded EBGs is substantially equal to the length of the vias connected to patches.

20 Claims, 10 Drawing Sheets

ELECTROMAGNETIC BAND GAP STRUCTURES AND METHOD FOR MAKING SAME

FIELD OF THE INVENTION

The present invention relates generally to a device having a strip line structure and, more specifically, to a method and device for noise mitigation and filtering.

BACKGROUND OF THE INVENTION

Electromagnetic band gap (EBG) structures are three-dimensional objects for preventing the propagation of the electromagnetic waves in a specified band of frequency for all angles and for all polarization states. An EBG structure normally consists of patches and vias which can be modeled as an equivalent circuit having a combination of resistors, capacitors and inductors. The patches can have different topologies.

It is advantageous and desirable to provide a method for producing EBG structures in high-speed printed wire board (PWB) and packages using multilayer technologies.

SUMMARY OF THE INVENTION

The present invention provides a method and an apparatus concerning an electromagnetic band gap (EBG) structure. The EBG structure has a plurality of cells arranged in a two-dimensional array. Each of the cells has an electrically conductive patch and an electrically conductive via coupled between the patch and a ground plane. One dimension of the EBG structure is folded such that at least one of patch in that dimension is folded into three sections located in different planes. With a 2-layer EBG structure, a singly-folded structure will have 4-layers with one or more folded patches located on one end of the folded EBG structure. If the 4-layer folded structure is further folded into an 8-layer structure, the folded EBG structure will have folded EBG patches on both ends. The 8-layer structure can be further folded if so desired.

Thus, the first aspect of the present invention is a method for producing a folded EBG structure. The method comprises:

providing a cell structure having a plurality of cells, each cell having an electrically conductive patch located on a first plane, and an electrically conductive via connected to the patch; and folding the cell structure such that the patch of at least one cell is folded into a first section located on the first plane, a second section located on a second plane substantially parallel to the first plane, and a third section between the first section and the second section, wherein the via of said at least one cell is connected to the third section. The via of said at least one cell is located on a third plane between the first and second planes.

According to the present invention, the via of each cell has a first via end and a second via end, the first via end connected to the patch, and the second via end of each cell is connected to a ground plane.

According to one embodiment of the present invention, the ground plane has a first ground plane section and a second ground plane section, and both the first and second ground plane sections are located on the third plane substantially parallel to the first plane. The plurality of cells can have a second cell and a third cell, and after folding:

in the second cell, the patch is located on the first plane and the via is connected between the patch and the first ground section on the third plane, and in the third cell, the patch is located on the second plane, and the via is connected between the patch and the second ground section on the third plane.

The folded structure can be further folded, such that the patch of the second cell is folded into a first section located on the first plane, a second section and a third section between the first section and the second section, wherein the via is connected to the third section on the fourth plane substantially parallel to the third plane further from the first plane, the second section is located on a sixth plane substantially parallel to the first plane further from the fourth plane, and the third section is located between the sixth plane and the first plane; and the patch of the third cell is folded into a first section located on the second plane, a second section and a third section, wherein the via is connected to the third section on the fifth plane substantially parallel to the third plane further from the second plane, the second section is located on a seventh plane substantially parallel to the second plane further from the fifth plane, and a third section is located between the second plane and the seventh plane.

According to another embodiment of the present invention, the ground plane comprises a first ground plane section, a second ground plane section substantially parallel to the first ground section, and a third ground plane section between the first ground plane section and the second ground plane section, wherein the first plane has a first side and an opposing second side, wherein the first ground section is located on a fourth plane on the first side spaced from and substantially parallel to the first plane, and the second ground section is located on a fifth plane on the second side such that the second plane is located between the third plane and the fifth plane. The plurality of cells can have a second cell and a third cell, and after folding:

in the second cell, the patch is located on the first plane and the via is connected between the patch and the first ground section on the fourth plane, and in the third cell, the patch is located on the second plane, and the via is connected between the patch and the second ground section on the fifth plane.

The cell structure can be further folded, such that the patch of the second cell is folded into a first section located on the first plane, the second section located on a sixth plane substantially parallel to the first plane further from the fourth plane, and a third section between the first section and the second section, wherein the via of the second cell is located on the fourth plane connected to the third section; and the patch of the third cell is folded into a first section located on the second plane, a second section located on a seventh plane substantially parallel to the second plane further from the fifth plane, and a third section between the first section and the second section, wherein the via of the third cell is located on the fifth plane connected to the third section.

The second aspect of the present invention is an apparatus, which comprises:

a ground plane; and a plurality of cells, each cell having an electrically conductive patch, and an electrically conductive via connected between the patch and the ground plane, wherein the patch of at least one cell comprises a first section located on a first plane, a second section located on a second plane substantially parallel to the first plane, and a third section located between the first section and the second section, wherein the via of said at least one cell is connected to the third section. The via of said at least one cell is located on a third plane between the first plane and the second plane.

According to one embodiment of the present invention, the ground plane comprises a first ground plane section and a second ground plane section, both the first and second ground plane sections are located on the third plane between the first plane and second plane and substantially parallel to the first plane.

According to one embodiment of the present invention, the plurality of cells includes a second cell and a third cell, such that in the second cell, the patch is located on the first plane and the via is connected between the patch and the first ground section on the third plane, and in the third cell, the patch is located on the second plane, and the via is connected between the patch and the second ground section on the third plane.

According to another embodiment of the present invention, the plurality of cells includes a second cell and a third cell, such that the patch of the second cell comprises a first section located on the first plane, a second section and a third section, wherein the via is connected to the third section on the fourth plane substantially parallel to the third plane further from the first plane, the second section is located on a sixth plane substantially parallel to the first plane further from the fourth plane, and the third section is located between the sixth plane and the first plane; and the patch of the third cell comprises a first section located on the second plane, a second section and a third section, wherein the via is connected to the third section on the fifth plane substantially parallel to the third plane further from the second plane, the second section is located on a seventh plane substantially parallel to the second plane further from the fifth plane, and a third section is located between the second plane and the seventh plane.

There can be more unfolded cells between the first and second cells, and between the first and third cells.

According to a different embodiment of the present invention, the ground plane comprises a first ground plane section, a second ground plane section substantially parallel to the first ground section, and a third ground plane section between the first ground plane section and the second ground plane section, and wherein the first plane has a first side and an opposing second side, wherein the first ground section is located on a fourth plane on the first side spaced from and substantially parallel to the first plane, and the second ground section is located on a fifth plane on the second side such that the second plane is located between the third and fifth planes.

According to one embodiment of the present invention, the plurality of cells includes a second cell and a third cell, such that in the second cell, the patch is located on the first plane and the via is connected between the patch and the first ground section on the fourth plane, and in the third cell, the patch is located on the second plane, and the via is connected between the patch and the second ground section on the fifth plane.

According to another embodiment of the present invention, the plurality of cells includes a second cell and a third cell, such that the patch of the second cell comprises a first section located on the first plane, the second section located on a sixth plane substantially parallel to the first plane further from the fourth plane, and a third section between the first section and the second section, wherein the via of the second cell is located on the fourth plane connected to the third section; and the patch of the third cell comprises a first section located on the second plane, a second section located on a seventh plane substantially parallel to the second plane further from the fifth plane, and a third section between the first section and the second section, wherein the via of the third cell is located on the fifth plane connected to the third section.

The folded EBG structures, according to various embodiments of the present invention, can be used a variety of electronic devices, such as mobile phones, computers, digital cameras and the like.

The present invention will become apparent upon reading the descriptions taken in conjunction with FIGS. 5a to 15.

BRIEF DESCRIPTION OF THE DRAWINGS

FIG. 14a shows a 2-layer basic EBG structure with 15 EBG cells in one dimension.

FIG. 14b shows a folded EBG structure of 4-layers from the EBG structure of FIG. 14a.

DETAILED DESCRIPTION OF THE INVENTION

Figure 1:
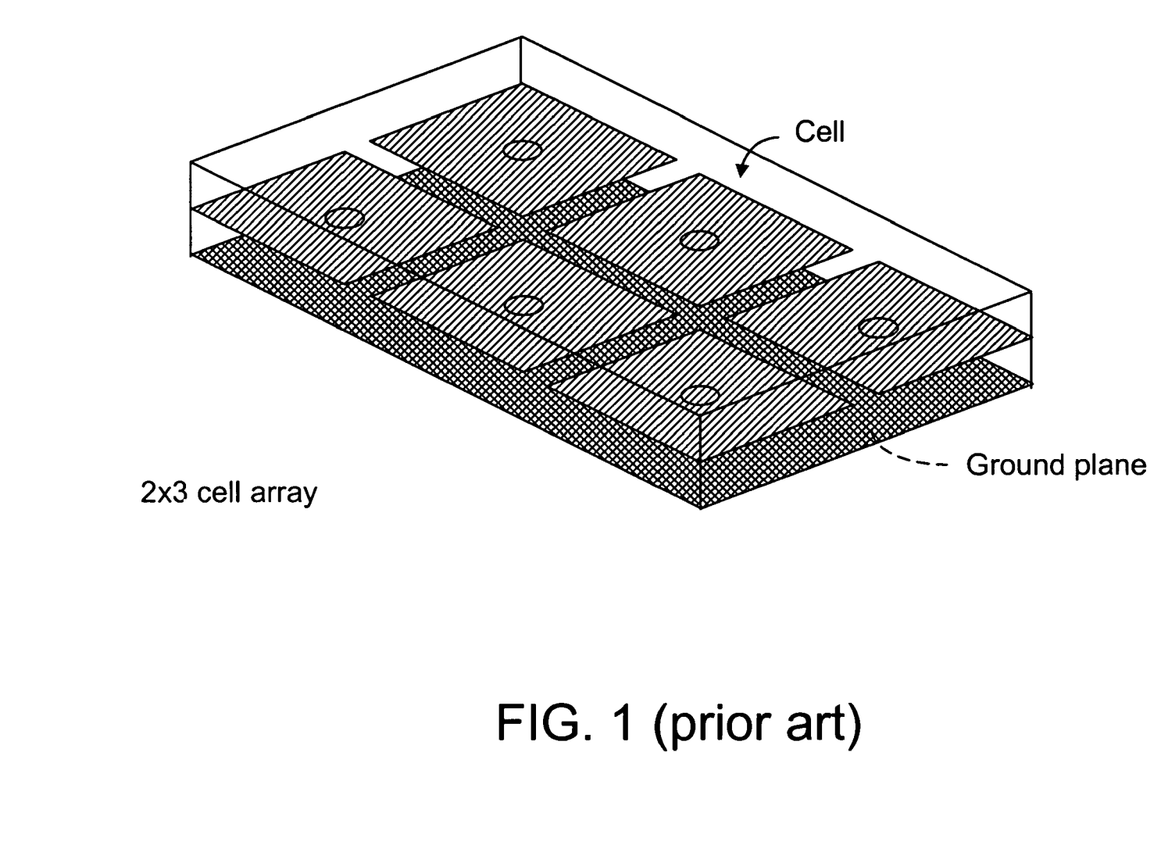
FIG. 1 shows a basic EBG structure having a two-dimensional array of EBG cells.
Figure 2A:
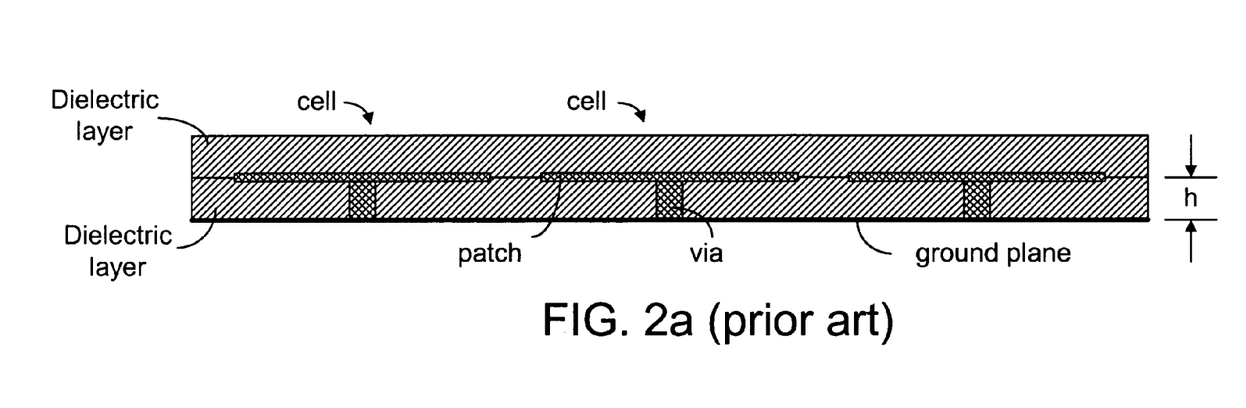
FIG. 2a shows a cross sectional view of the basic EBG structure.
Figure 2B:
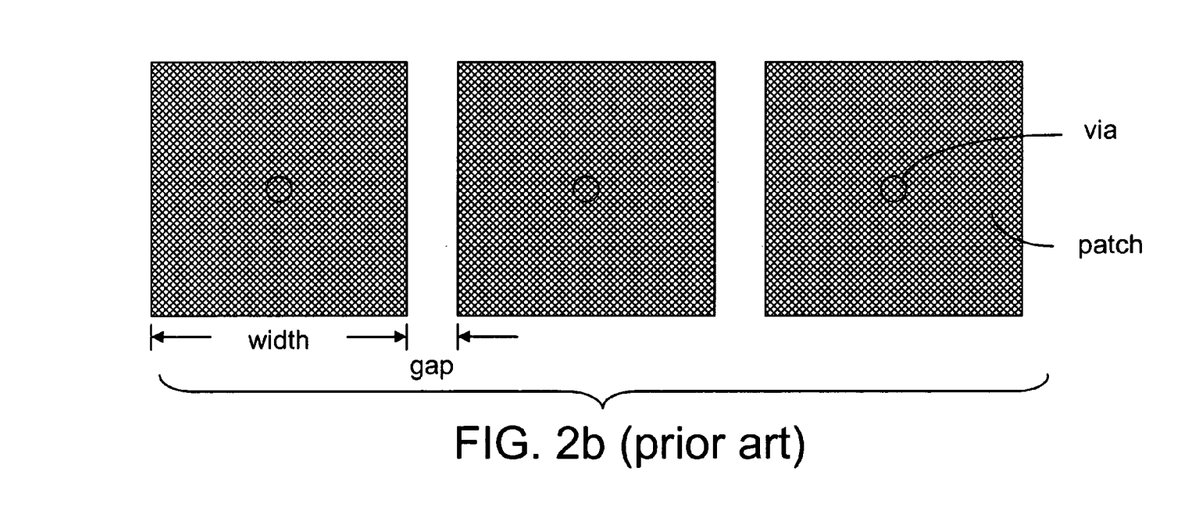
FIG. 2b shows a top-view of the basic EBG structure.
Figure 4:
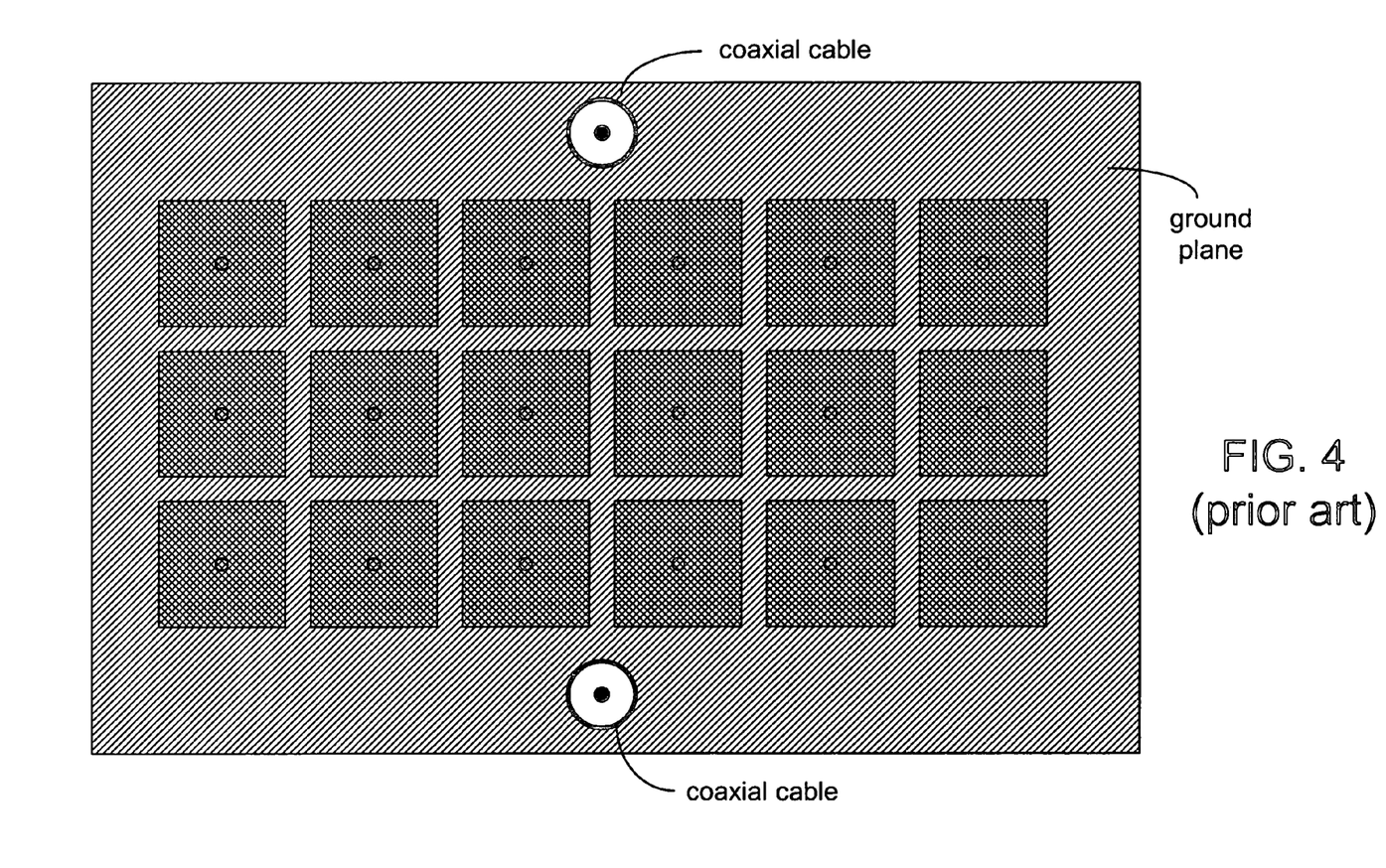
FIG. 4 shows another basic EBG structure having a larger array of EBG cells.

Electromagnetic band gap (EBG) structures consist of electrically conducting patches periodically arranged in an array. Each of the patches has an electrically conducting via connecting to a common electrically conducting plane. A basic EBG structure having a 2×3 array of EBG cells is shown in FIG. 1. As shown in FIGS. 1, 2a and 2b, each of cells has a rectangular patch made of an electrically conductive material and an electrically conductive via (see FIG. 2a) connecting the patch to a ground plane. It should be noted that the geometry of the patch can be varied and the size of the patches corresponds to a certain frequency range of operation for use in noise mitigation in most EMI/EMC applications. The size of the patches is, in general, proportional to the wavelength. For example, to operate in the lower microwave region (1-5 GHz), patches of 1-2 cm in width are typical. For operation in circuit board (packages or transmission lines), the size of such a patch may occupy a large part of a circuit board or may exceed the size of the entire circuit board or package. This poses a great challenge to an application where two radiating devices are needed to be electromagnetically isolated. For example, in isolating two radiating sources of EMI that are 1-4 cm apart and the sources are operating in the lower microwave regime, a few planar patches of 1-2 cm each will not fit between the two sources. Likewise, in filtering unwanted signals on transmission lines, a few planar patches of 1-2 cm each will not fit the gap between the two transmission lines. As the frequency increases and integration increases, the coupling between transmission lines increases. Unwanted signal filtering becomes more and more difficult. For lines with very close proximity, any isolation mechanism used must be smaller in size than the separation between the sources. An example of filtering unwanted signals between two transmission lines in a basic EBG structure is shown in FIG. 4. As shown in FIG. 4, transmission lines are electrically shielded in the coaxial cables with the shielding connected to the ground plane.

Figures 3A, 3B:
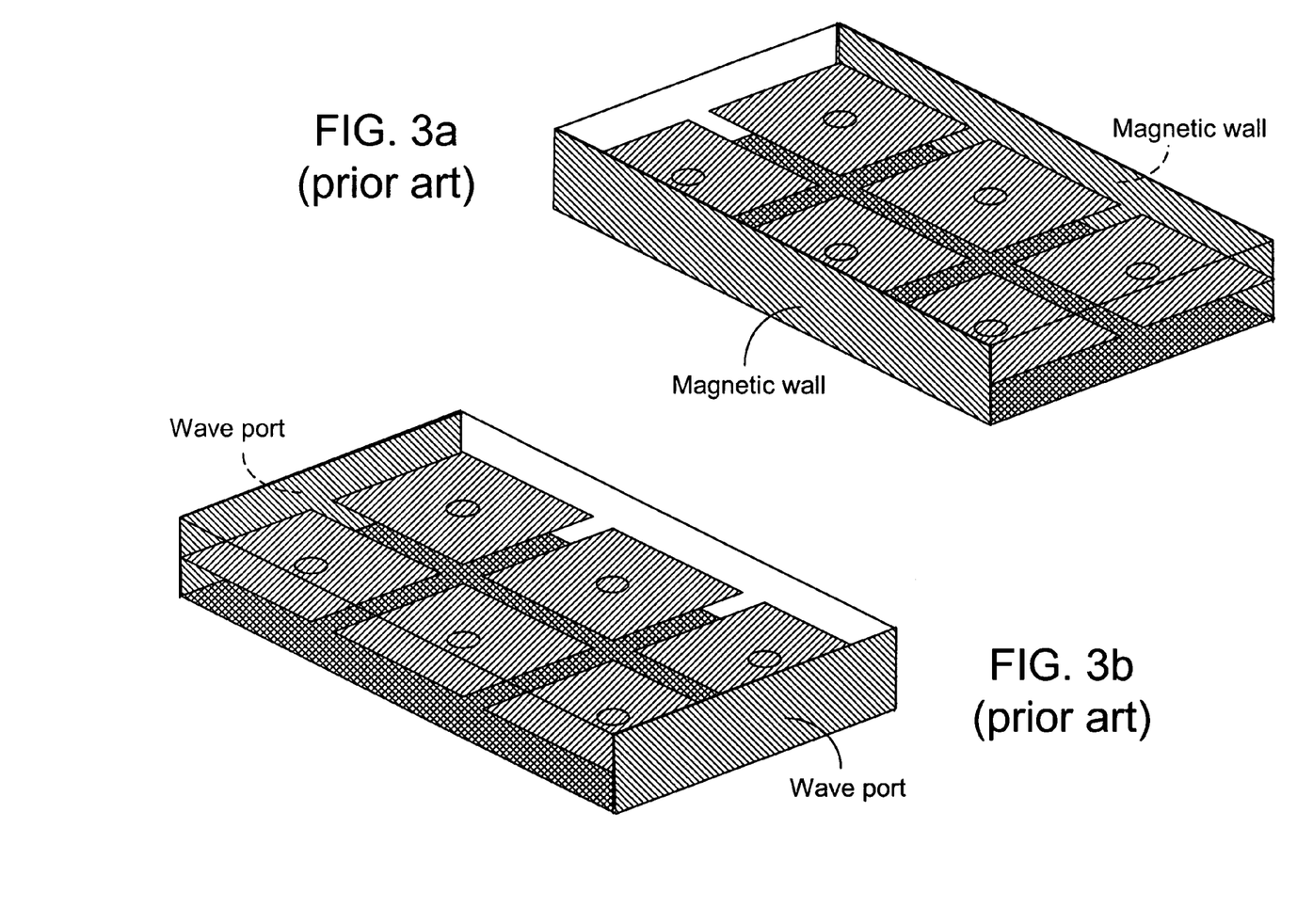
FIG. 3a shows the location of magnetic walls in an EBG structure.
FIG. 3b shows the location of wave ports in an EBG structure.

A practical EBG structure may have a periodic array of patches wherein the center-to-center distance between two adjacent patches is 10 mm, for example. With a gap between two adjacent patches of 0.4 mm, the width of the patch can be 9.8 mm, for example. In a strip-line structure, the patches are located between two layers of dielectric material as shown in FIG. 2b. The diameter of the vias can be 0.4 mm and the height of the vias can be 1.54 mm, for example. The thickness of each dielectric layer can be 1.54 mm, for example. The dielectric material can be FR-4 and the electrically conductive material can be gold, copper, or any suitable material. The basic EBG structure, as shown in FIG. 1, is known as a straight-line structure where the line is formed by the six EBG cell elements. The structure can be excited with wave ports. The location of the wave ports is shown in FIG. 3b. The wave ports are located on two opposite side-walls. The other pair of side-walls has perfect magnetic wall-boundary condition, as shown in FIG. 3a.

Figures 5A, 5B, 6A, 6B, 7A, 7B:
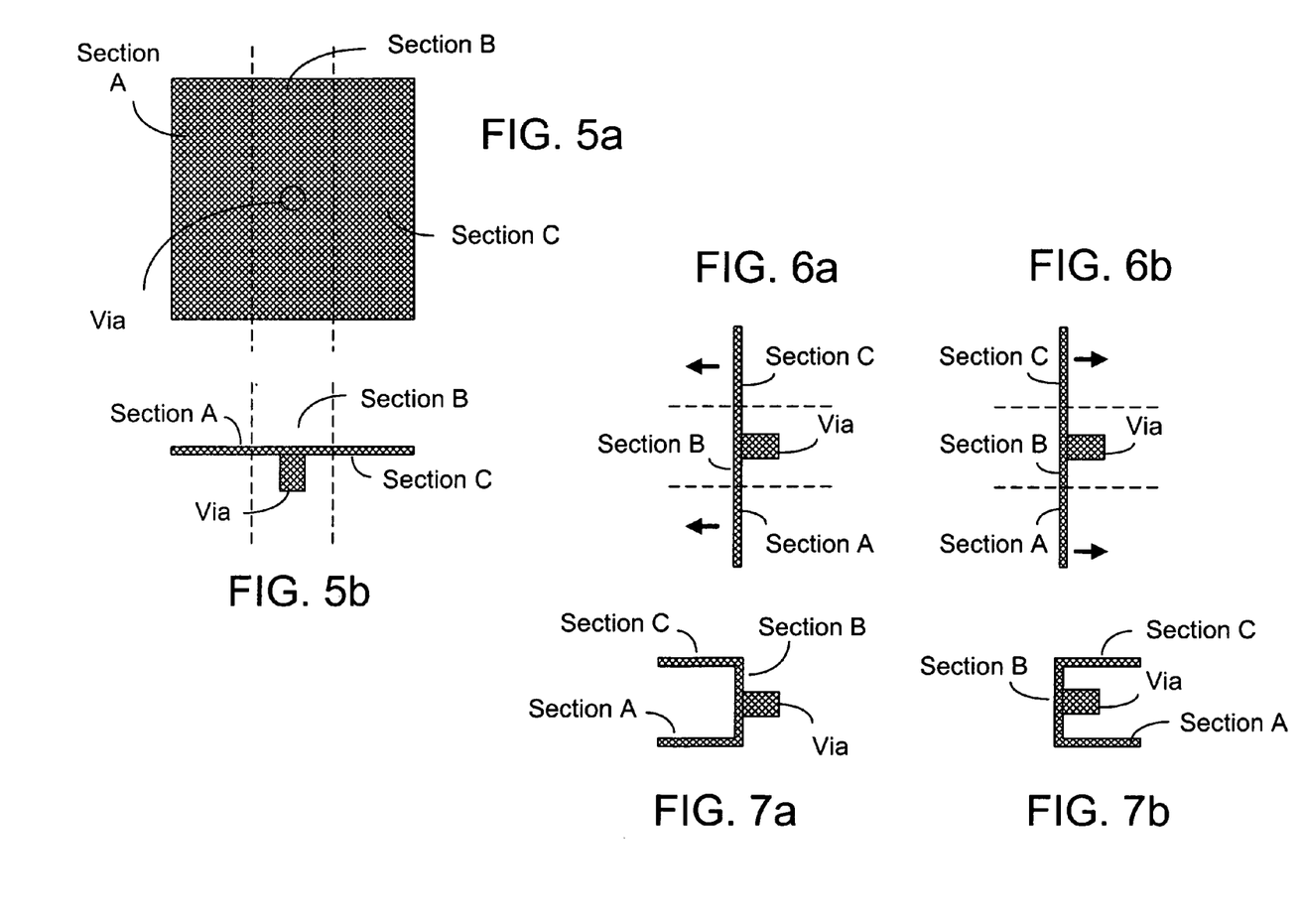
FIG. 5a shows a method of folding an EBG cell, according to one embodiment of the present invention.
FIG. 5b shows a different view of the EBG cell to be folded.
FIG. 6a shows one way of folding an EBG cell.
FIG. 6b shows another way of folding an EBG cell.
FIG. 7a shows a folded EBG cell, according to one embodiment of the present invention.
FIG. 7b shows a folded EBG cell, according to another embodiment of the present invention.

The present invention uses folding to reduce one linear dimension of the patches. In one embodiment of the present invention, the patch in each EBG element is folded into three parts. For example, the patch can be divided into three sections: a first side section A, a second side section C and a middle section B, as shown in FIGS. 5a and 5b. The sections are folded along the dotted lines. In order to show how a patch located on a horizontal plane is folded, the entire EBG element is rotated in a counter-clockwise direction as shown in FIGS. 6a and 6b. The EBG element can be folded in an outward fashion or in an inward fashion, as indicated by the arrows in FIGS. 6a and 6b, respectively. After folding, sections A and C are located on horizontal planes, whereas section B is located on a vertical plane. The via is now located on another horizontal plane, as shown in FIG. 7a (outward folding) and FIG. 7b (inward folding).

Figure 8:
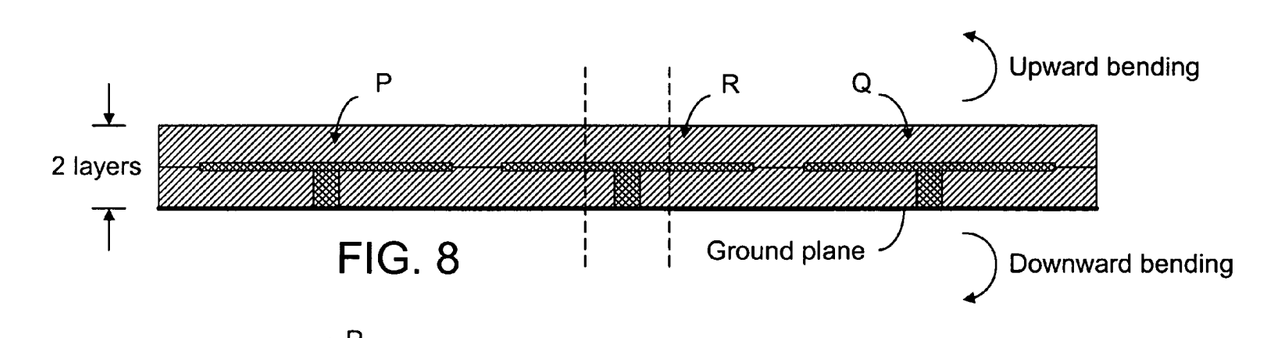
FIG. 8 shows a basic EBG structure of 2 layers.
Figure 9A:
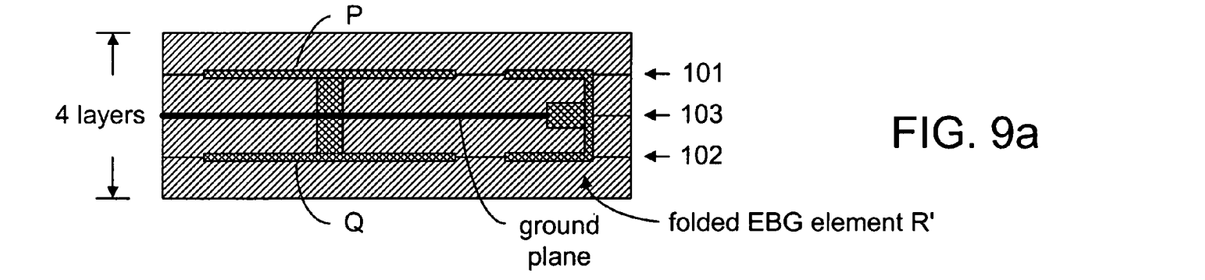
FIG. 9a shows a folded EBG structure having 4 layers, according to one embodiment of the present invention.
Figure 9B:
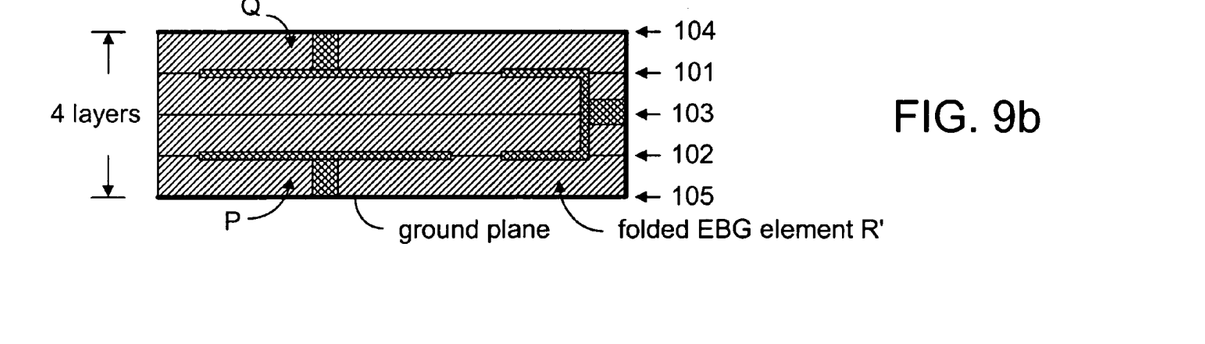
FIG. 9b shows a folded EBG structure having 4 layers, according to another embodiment of the present invention.

With an EBG structure with three EBG elements P, Q and R in one dimension, as shown in FIG. 8, it is possible to fold the EBG structure in different ways. When the middle EBG element R is selected for folding, then the result can be the folded structure of FIG. 9a or the folded structure of FIG. 9b. In the folded EBG structure as shown in FIG. 9a, the folded EBG element R' is folded in an inward fashion. In the folded EBG structure as shown in FIG. 9b, the folded EBG element R' is folded in an outward fashion. With such folding, the thickness of the EBG structures is increased from two layers to four layers while one dimension is reduced to about half.

Figure 10A:
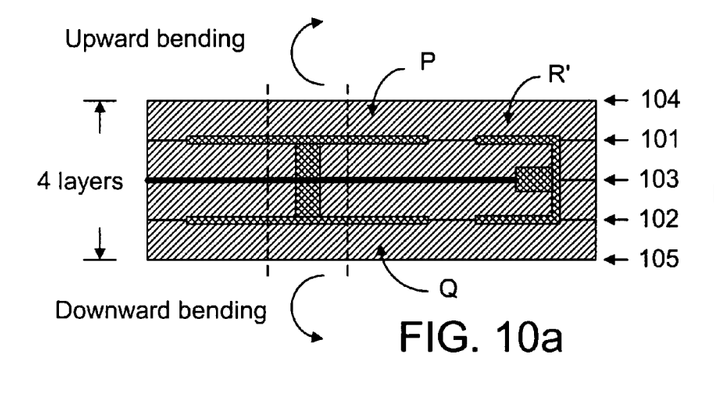
FIG. 10a shows a method for folding a 4-layer EBG structure into an 8-layer EBG structure, according to one embodiment of the present invention.
Figure 10B:
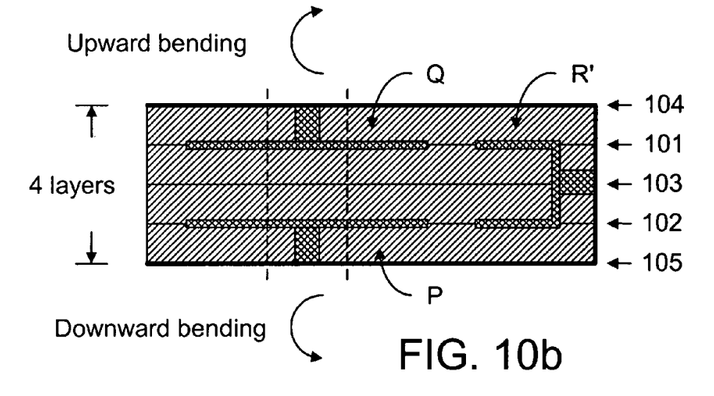
FIG. 10b shows a method for folding a 4-layer EBG structure into an 8-layer EBG structure, according to another embodiment of the present invention.
Figure 11A:
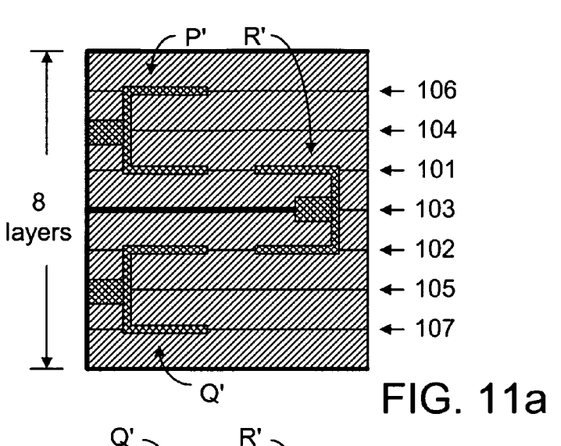
FIG. 11a shows a folded EBG structure having 8 layers, according to one embodiment of the present invention.
Figure 11B:
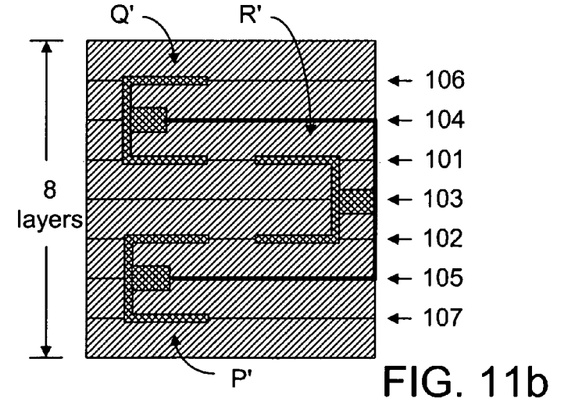
FIG. 11b shows a folded EBG structure having 8 layers, according to another embodiment of the present invention.

The 4-layer folded EBG structures as shown in FIGS. 9a and 9b can be further folded into EBG structures of 8-layers. As shown in FIG. 10a, each of the unfolded EBG elements P and Q can be folded in an outward fashion. After folding, the further folded structure is shown in FIG. 11a. As shown in FIG. 10b, each of the unfolded EBG elements P and Q can be folded in an inward fashion. After folding, the further folded structure is shown in FIG. 11b. The increase in the number of layers can be viewed as the result of vertical integration which not only reduces the device size but also improves the performance.

Figure 12:
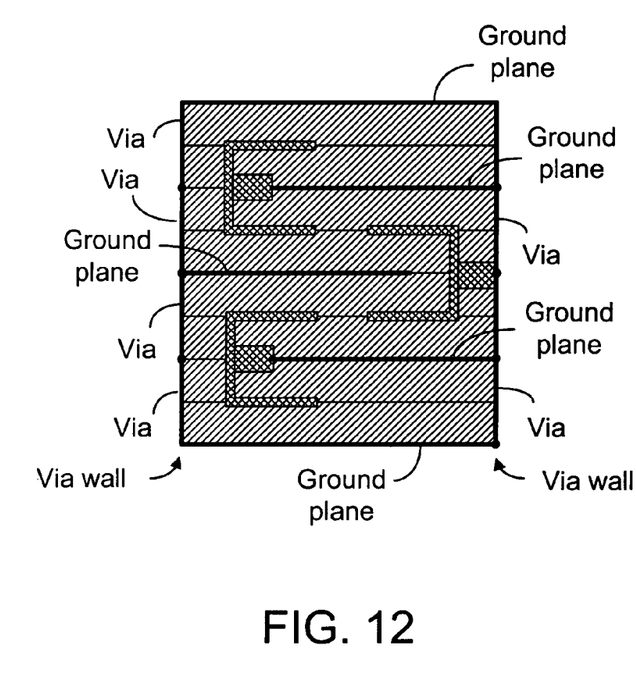
FIG. 12 shows electrically conducting vias in a folded EBG structure.
Figure 13:
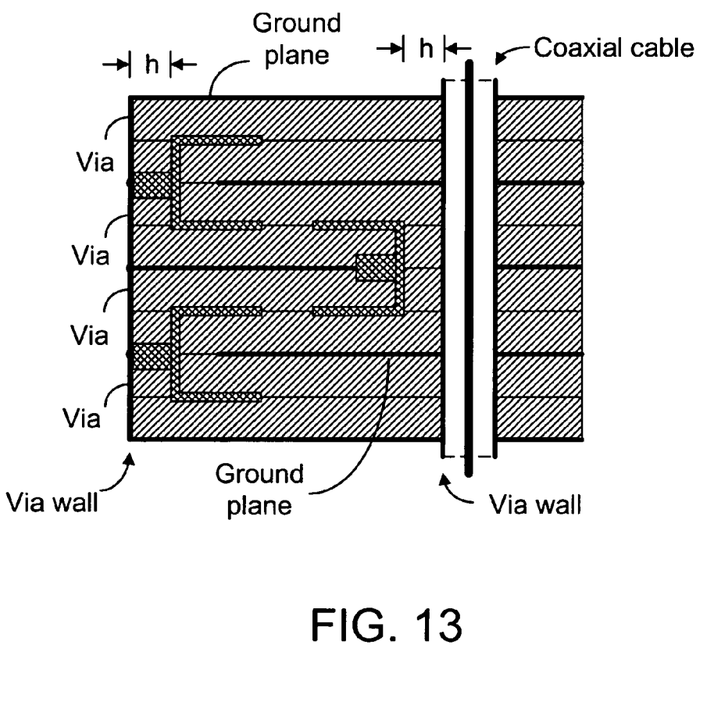
FIG. 13 shows a coaxial cable in a folded EBG structure.

In the vertical integration of EBG elements, according to various embodiments of the present invention, ground planes are provided in the stacked stripline structures and electrically conductive vias are used to provide connections between ground planes, as shown in FIG. 12. Furthermore, the via in each folded EBG element is also connected to the ground planes. When a coaxial cable is used for signal input or output, the shielding jacket of the coaxial cable is connected to the ground planes. The wave port locations of such a folded model are at the cross section at each ends of the coaxial cable.

Figures 14A, 14B:
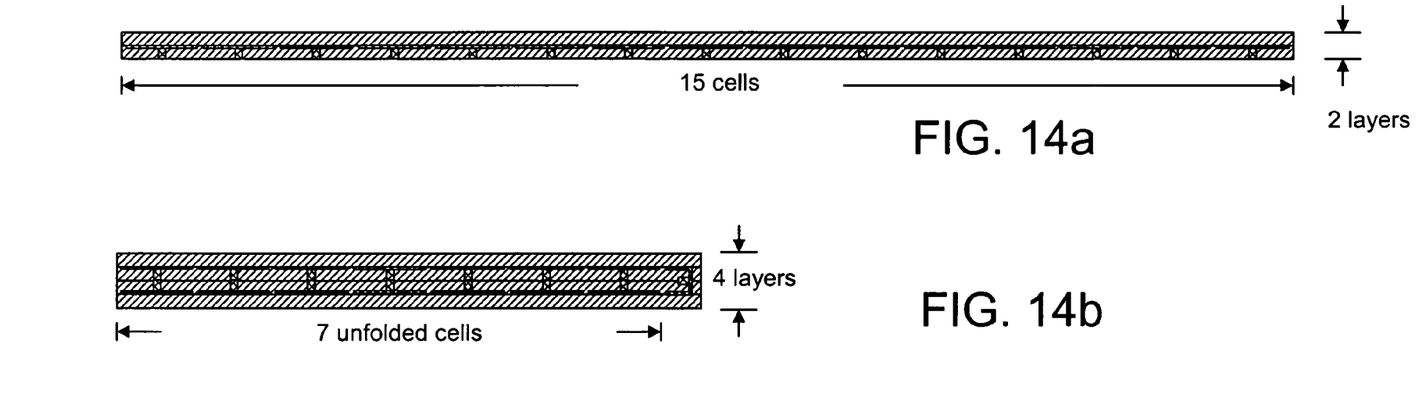
Figure 14C:
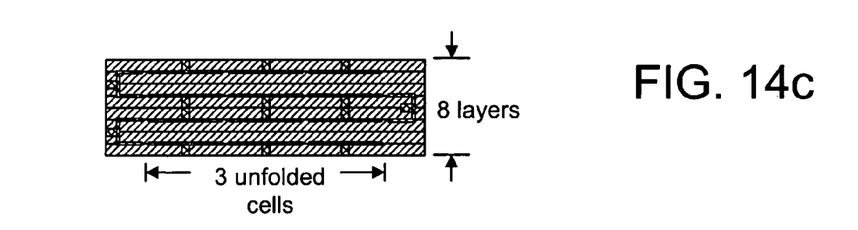
FIG. 14c shows a folded EBG structure of 8-layers from the EBG structure of FIG. 14b.

In the 2-layer EBG structure as shown in FIG. 8, the number of EBG cells or elements in the dimension to be folded is three (P, Q, R). After the structure is folded into a folded structure having 8-layers, there is no unfolded EBG element between the folded EBG elements P' and R' or between the folded EBG elements Q' and R', as shown in FIGS. 11a and 11b. With a 2-layer EBG structure having more EBG elements, the folded structure can be different. For example, with a 2-layer EBG structure having 15 EBG cells or elements as shown in FIG. 14a, it is possible to fold the 2-layer structure into a 4-layer folded EBG structure as shown in FIG. 14b. The 4-layer structure can be further folded into an 8-layer structure as shown in FIG. 14c. In such an 8-layer folded EBG structure, there are twelve unfolded EBG elements arranged in four layers between the folded EBG elements. It should be noted that, in the folded structure as shown in FIG. 14b, the folded EBG element is folded in an inward fashion, but it can also be folded in an outward fashion (see FIG. 9b).

The EBG structure, according to various embodiments of the present invention, comprises: a ground plane; and a plurality of cells, each cell having an electrically conductive patch, and an electrically conductive via connected between the patch and the ground plane, wherein the patch of at least one cell comprises a first section located on a first plane 101, a second section located on a second plane 102 substantially parallel to the first plane, and a third section located between the first section and the second section, wherein the via of said at least one cell is connected to the third section. The via of said at least one cell is located on a third plane 103 between the first plane and the second plane (see FIGS. 9a and 9b).

In the embodiment as shown in FIG. 9a, the ground plane includes a first ground plane section and a second ground plane section, both the first and second ground plane sections are located on the third plane between the first plane and second plane and substantially parallel to the first plane.

In the embodiment as shown in FIG. 9b, the ground plane includes a first ground plane section, a second ground plane section substantially parallel to the first ground section, and a third ground plane section between the first ground plane section and the second ground plane section, and wherein the first plane has a first side and an opposing second side, wherein the first ground section is located on a fourth plane 104 on the first side spaced from and substantially parallel to the first plane, and the second ground section is located on a fifth plane 105 on the second side such that the second plane is located between the third and fifth planes.

In the embodiment as shown in FIG. 9b, the plurality of cells also includes a second cell Q and a third cell P, wherein, in the second cell Q, the patch is located on the first plane and the via is connected between the patch and the first ground section on the fourth plane, and in the third cell P, the patch is located on the second plane, and the via is connected between the patch and the second ground section on the fifth plane.

In the embodiment as shown in FIG. 9a, the plurality of cells also includes a second cell P and a third cell Q, wherein, in the second cell P, the patch is located on the first plane and the via is connected between the patch and the first ground section on the third plane, and in the third cell Q, the patch is located on the second plane, and the via is connected between the patch and the second ground section on the third plane.

In the embodiment as shown in FIG. 11b, the plurality of cells further includes a second cell Q' and a third cell P', wherein the patch of the second cell Q' comprises a first section located on the first plane, the second section located on a sixth plane 106 substantially parallel to the first plane further from the fourth plane, and a third section between the first section and the second section, wherein the via of the second cell is located on the fourth plane connected to the third section; and the patch of the third cell P' comprises a first section located on the second plane, a second section located on a seventh plane 107 substantially parallel to the second plane further from the fifth plane, and a third section between the first section and the second section, wherein the via of the third cell is located on the fifth plane connected to the third section.

In the embodiment as shown in FIG. 11a, the plurality of cells further includes a second cell P' and a third cell Q', wherein the patch of the second cell P' comprises a first section located on the first plane, a second section and a third section, wherein the via is connected to the third section on the fourth plane substantially parallel to the third plane further from the first plane, the second section is located on a sixth plane 106 substantially parallel to the first plane further from the fourth plane, and the third section is located between the sixth plane and the first plane; and the patch of the third cell Q' comprises a first section located on the second plane, a second section and a third section, wherein the via is connected to the third section on the fifth plane substantially parallel to the third plane further from the second plane, the second section is located on a seventh plane 107 substantially parallel to the second plane further from the fifth plane, and a third section is located between the second plane and the seventh plane.

The method for producing an EBG structure, according to some embodiments of the present invention, comprises:

providing a cell structure having a plurality of cells, each cell having an electrically conductive patch located on a first plane 101, and an electrically conductive via connected to the patch; and folding the cell structure such that the patch of at least one cell is folded into a first section located on the first plane, a second section located on a second plane 102 substantially parallel to the first plane, and a third section between the first section and the second section, wherein the via of said at least one cell is connected to the third section. The via of said at least one cell is located on a third plane 103 between the first and second planes.

In general, the via of each cell has a first via end and a second via end, and the first via end is connected to the patch. The method further comprises:

providing a ground plane on the cell structure, wherein the second via end of each cell is connected to the ground plane. The ground plane comprises a first ground plane section and a second ground plane section, both the first and second ground plane sections are located on the third plane substantially parallel to the first plane (see FIG. 9a).

In the embodiment as shown in FIG. 9b, the ground plane comprises a first ground plane section, a second ground plane section substantially parallel to the first ground section, and a third ground plane section between the first ground plane section and the second ground plane section, and wherein the first plane has a first side and an opposing second side, wherein the first ground section is located on a fourth plane 104 on the first side spaced from and substantially parallel to the first plane, and the second ground section is located on a fifth plane on the second side such that the second plane is located between the third plane and the fifth plane. As shown in FIG. 9b, the plurality of cells further include a second cell Q and a third cell P, and wherein, after the folding, in the second cell, the patch is located on the first plane and the via is connected between the patch and the first ground section on the fourth plane, and in the third cell, the patch is located on the second plane, and the via is connected between the patch and the second ground section on the fifth plane.

The embodiment as shown in FIG. 9b can be further folded into the embodiment of FIG. 11b, such that the patch of the second cell Q' is folded into a first section located on the first plane, the second section located on a sixth plane substantially parallel to the first plane further from the fourth plane, and a third section between the first section and the second section, wherein the via of the second cell is located on the fourth plane connected to the third section; and the patch of the third cell P' is folded into a first section located on the second plane, a second section located on a seventh plane substantially parallel to the second plane further from the fifth plane, and a third section between the first section and the second section, wherein the via of the third cell is located on the fifth plane connected to the third section.

In the embodiment as shown in FIG. 9a, the plurality of cells further includes a second cell P and a third cell Q, wherein, after the folding, in the second cell P, the patch is located on the first plane and the via is connected between the patch and the first ground section on the third plane, and in the third cell Q, the patch is located on the second plane, and the via is connected between the patch and the second ground section on the third plane.

The embodiment as shown in FIG. 9a can be further folded into the embodiment of FIG. 11a, such that the patch of the second cell P' is folded into a first section located on the first plane, a second section and a third section between the first section and the second section, wherein the via is connected to the third section on the fourth plane substantially parallel to the third plane further from the first plane, the second section is located on a sixth plane substantially parallel to the first plane further from the fourth plane, and the third section is located between the sixth plane and the first plane; and the patch of the third cell Q' is folded into a first section located on the second plane, a second section and a third section, wherein the via is connected to the third section on the fifth plane substantially parallel to the third plane further from the second plane, the second section is located on a seventh plane substantially parallel to the second plane further from the fifth plane, and a third section is located between the second plane and the seventh plane.

In the folded EBG structures, according to various embodiments of the present invention, via walls having a plurality of electrically conductive vias are used to provide connections between the vias on the folded EBG cells to the ground. The distance between the via walls and the folded patches is substantially equal to the length of the vias attached to the patches.

In light of the high potential for EBGs in suppressing noise and unwanted signals and in light of the strong applicability of EBGs in a variety of technologies and application, miniaturization of these structures is becoming increasingly important. According to various embodiments of the present invention, the physical dimensions of the EBG structures can be significantly reduced, while maintaining a constant frequency band of operation. The miniaturized EBG structures, according to the present invention, can at least be used in the following technological areas:

1. Electrically-small antennas in which the folded EBG structure includes multi-resonant EBG sub-structures and the miniaturized EBG patches are located within the body of the antenna itself;
2. Isolation of low-profile antennas lying within close proximity to each other;
3. Noise mitigation in printed circuit boards, printed wire boards and packages;
4. Filters for unwanted signal filtering;
5. Bendable signal traces on flexible dielectric substrates.

Figure 15:
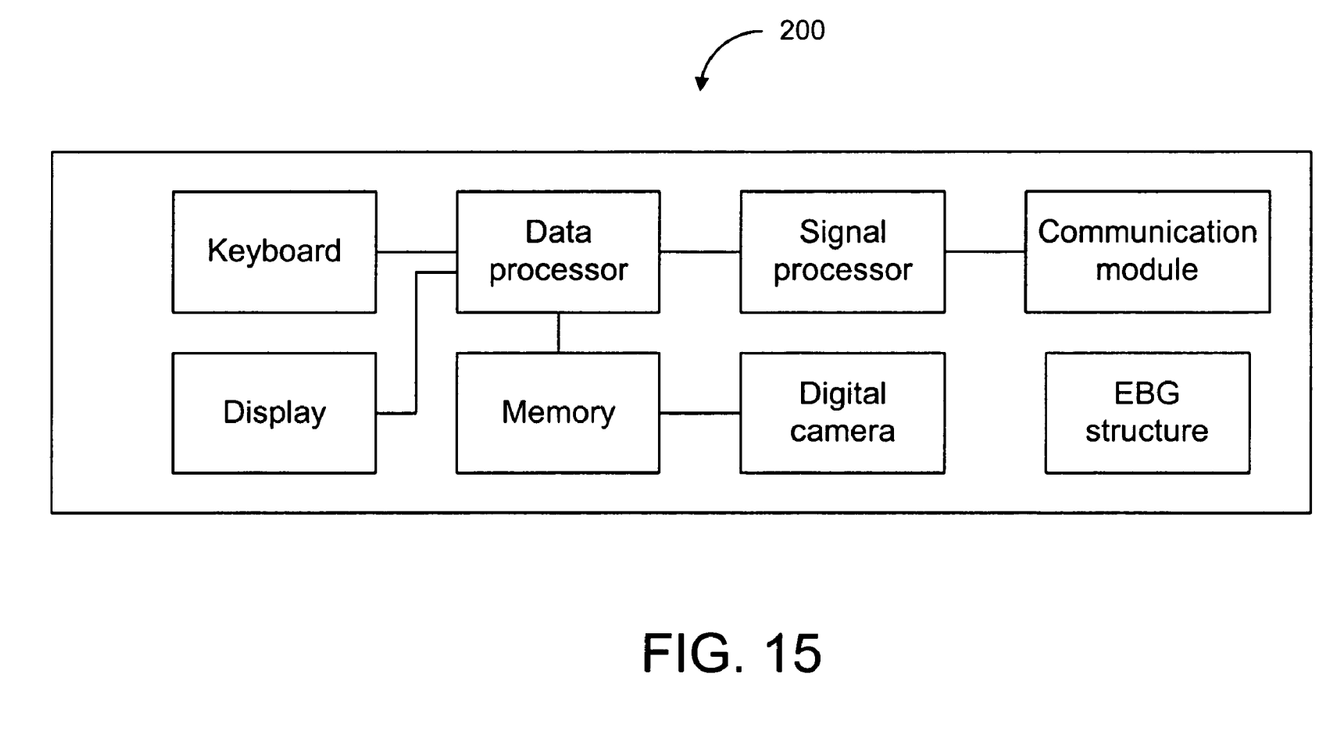
FIG. 15 shows an electronic device having one or more folded EBG structures, according to the present invention.

Moreover, in digital circuits that uses standard printed circuit board (PCB) or printed wire board technology, fast switching may create simultaneous switching noise (SSN), which is also known as ground bounce or Delta-1 noise. Switching noise can produce several low and/or high frequency anomalies. When these anomalies occur at the biasing of the power planes, they may lead to logic errors in digital circuits. SSN is an important issue in the design of high-speed PCBs and packages. With the fast increase of clock speed in digital circuits, the suppression of SSN becomes more important. Thus, the folded EBG structures, according to various embodiments of the present invention, can be used in many electronic devices, such as mobile phone, laptop computers, personal digital assistant devices, digital cameras and the like. FIG. 15 is a schematic representation of such an electronic device. As shown in FIG. 15, the electronic device has a data processor, a signal processor and a memory module. It may have a communication module including a transceiver front-end coupled to an antenna, a keyboard, a display and a digital camera. One or more folded EBGs can be used for noise mitigation in various components in the electronic device.

The present invention has been disclosed in various embodiments, including the method of folding these embodiments. It should be noted that the same EBG cell structures may be achievable by different methods. Furthermore, if a 2-layer basic EBG structure is folded only once, only one end of the folded EBG structure has one or more folded EBG cells and the folded EBG structure has 4-layers (see FIGS. 9a and 9b). If the 2-layer basic EBG structure is folded more than once into an 8-layer folded EBG structure, both ends of the folded EBG structure will have folded EBG cells (see FIGS. 11a and 11b). An 8-layer folded EBG structure can be further folded into a 12-layer folded structure, a 16-layer folded structure, and so on, and all of these folded structures will have folded EBG cells.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. A method comprising:
    providing a cell structure having a plurality of cells, each cell having an electrically conductive patch located on a first plane, and an electrically conductive via connected between the patch and a ground plane; and
    folding the cell structure such that the patch of at least one cell is folded into a first section located on the first plane, a second section located on a second plane different from the first plane, spaced from the first plane and substantially parallel to the first plane, and a third section between the first section and the second section, wherein the via of said at least one cell is connected to the third section, wherein the via of said at least one cell is located on a third plane between the first plane and the second plane, and the third plane is different from the first plane and the second plane.

2. The method of claim 1, wherein the via of each cell has a first via end and a second via end, the first via end connected to the patch, said method further comprising:
    providing the ground plane on said cell structure, wherein the second via end of each cell is connected to the ground plane.

3. The method of claim 2, wherein the ground plane comprises a first ground plane section and a second ground plane section, both the first and second ground plane sections are located on the third plane substantially parallel to the first plane.

4. The method of claim 2, wherein the ground plane comprises a first ground plane section, a second ground plane section substantially parallel to the first ground section, and a third ground plane section between the first ground plane section and the second ground plane section, and wherein the first plane has a first side and an opposing second side, wherein the first ground section is located on a fourth plane on the first side spaced from and substantially parallel to the first plane, and the second ground section is located on a fifth plane on the second side such that the second plane is located between the third plane and the fifth plane.

5. The method of claim 3, wherein said plurality of cells further comprises a second cell and a third cell, and wherein, after said folding,
    in the second cell, the patch is located on the first plane and the via is connected between the patch and the first ground section on the third plane, and
    in the third cell, the patch is located on the second plane, and the via is connected between the patch and the second ground section on the third plane.

6. The method of claim 4, wherein said plurality of cells further comprises a second cell and a third cell, and wherein, after said folding,
    in the second cell, the patch is located on the first plane and the via is connected between the patch and the first ground section on the fourth plane, and
    in the third cell, the patch is located on the second plane, and the via is connected between the patch and the second ground section on the fifth plane.

7. The method of claim 5, further comprising:
further folding the cell structure such that
the patch of the second cell is folded into a first section located on the first plane, a second section and a third section between the first section and the second section, wherein the via is connected to the third section on the fourth plane substantially parallel to the third plane further from the first plane, the second section is located on a sixth plane substantially parallel to the first plane further from the fourth plane, and the third section is located between the sixth plane and the first plane; and
the patch of the third cell is folded into a first section located on the second plane, a second section and a third section, wherein the via is connected to the third section on the fifth plane substantially parallel to the third plane further from the second plane, the second section is located on a seventh plane substantially parallel to the second plane further from the fifth plane, and a third section is located between the second plane and the seventh plane.

8. The method of claim 6, further comprising:
further folding the cell structure such that
the patch of the second cell is folded into a first section located on the first plane, the second section located on a sixth plane substantially parallel to the first plane further from the fourth plane, and a third section between the first section and the second section, wherein the via of the second cell is located on the fourth plane connected to the third section; and
the patch of the third cell is folded into a first section located on the second plane, a second section located on a seventh plane substantially parallel to the second plane further from the fifth plane, and a third section between the first section and the second section, wherein the via of the third cell is located on the fifth plane connected to the third section.

9. An apparatus comprising:
a ground plane; and
a plurality of cells, each cell having an electrically conductive patch, and an electrically conductive via connected between the patch and the ground plane, wherein
the patch of at least one cell comprises a first section located on a first plane, a second section located on a second plane different from the first plane, spaced from the first plane and substantially parallel to the first plane, and a third section located between the first section and the second section, wherein the via of said at least one cell is connected to the third section, wherein the via of said at least one cell is located on a third plane between the first plane and the second plane, wherein the third plane is different from the first plane and the second plane.

10. The apparatus of claim 9, wherein the ground plane comprises a first ground plane section and a second ground plane section, both the first and second ground plane sections are located on the third plane between the first plane and second plane and substantially parallel to the first plane.

11. The apparatus of claim 9, wherein the ground plane comprises a first ground plane section, a second ground plane section substantially parallel to the first ground section, and a third ground plane section between the first ground plane section and the second ground plane section, and wherein the first plane has a first side and an opposing second side, wherein the first ground section is located on a fourth plane on the first side spaced from and substantially parallel to the first plane, and the second ground section is located on a fifth plane on the second side such that the second plane is located between the third and fifth planes.

12. A mobile terminal, comprising an apparatus according to claim 9.

13. A digital camera, comprising an apparatus according to claim 9.

14. A computer, comprising an apparatus according to claim 9.

15. The apparatus of claim 10, wherein said plurality of cells further comprises a second cell and a third cell, and wherein,
in the second cell, the patch is located on the first plane and the via is connected between the patch and the first ground section on the third plane, and
in the third cell, the patch is located on the second plane, and the via is connected between the patch and the second ground section on the third plane.

16. The apparatus of claim 10, wherein said plurality of cells further comprises a second cell and a third cell, and wherein
the patch of the second cell comprises a first section located on the first plane, a second section and a third section, wherein the via is connected to the third section on the fourth plane substantially parallel to the third plane further from the first plane, the second section is located on a sixth plane substantially parallel to the first plane further from the fourth plane, and the third section is located between the sixth plane and the first plane; and
the patch of the third cell comprises a first section located on the second plane, a second section and a third section, wherein the via is connected to the third section on the fifth plane substantially parallel to the third plane further from the second plane, the second section is located on a seventh plane substantially parallel to the second plane further from the fifth plane, and a third section is located between the second plane and the seventh plane.

17. The apparatus of claim 11, wherein said plurality of cells further comprises a second cell and a third cell, and wherein,
in the second cell, the patch is located on the first plane and the via is connected between the patch and the first ground section on the fourth plane, and
in the third cell, the patch is located on the second plane, and the via is connected between the patch and the second ground section on the fifth plane.

18. The apparatus of claim 11, wherein said plurality of cells further comprises a second cell and a third cell, and wherein
the patch of the second cell comprises a first section located on the first plane, the second section located on a sixth plane substantially parallel to the first plane further from the fourth plane, and a third section between the first section and the second section, wherein the via of the second cell is located on the fourth plane connected to the third section; and
the patch of the third cell comprises a first section located on the second plane, a second section located on a seventh plane substantially parallel to the second plane further from the fifth plane, and a third section between the first section and the second section, wherein the via of the third cell is located on the fifth plane connected to the third section.

19. The apparatus of claim 16, further comprising a first end and an opposing second end, wherein the first cell is located at the first end, and the second cell and the third cell are located at the second end, and wherein said plurality of cells further comprises at least a fourth cell located between the first and second cells, and at least a fifth cell located between the first and third cells.

20. The apparatus of claim 18, further comprising a first end and an opposing second end, wherein the first cell is located at the first end, and the second cell and the third cell are located at the second end, and wherein said plurality of cells further comprises at least a fourth cell located between the first and second cells, and at least a fifth cell located between the first and third cells.

* * * * *